United States Patent [19]
Pavlu et al.

[11] Patent Number: 5,175,605
[45] Date of Patent: Dec. 29, 1992

[54] SINGLE EVENT UPSET HARDENING CIRCUITS, DEVICES AND METHODS

[75] Inventors: James A. Pavlu, Huntington Beach; Gary L. Heimbigner, Anaheim, both of Calif.

[73] Assignee: Rockwell International Corporation, El Segundo, Calif.

[21] Appl. No.: 474,608

[22] Filed: Feb. 5, 1990

[51] Int. Cl.⁵ .................. H01L 27/02; H03K 19/003; H03K 19/0948

[52] U.S. Cl. .................................. 257/369; 307/441; 307/443; 307/451; 257/921

[58] Field of Search ...................... 307/443, 451, 441; 357/41, 42

[56] References Cited

U.S. PATENT DOCUMENTS 4,833,347 5/1989 Rabe ................................. 307/443
4,937,473 6/1990 Statz et al. ....................... 307/443

Primary Examiner—Gene M. Munson
Attorney, Agent, or Firm—H. Fredrick Hamann; George A. Montanye; Wilfred G. Caldwell

[57] ABSTRACT

The present invention provides a unique circuit and layout methods for improving upon series redundant circuits. A substitution device, comprising a pair of series connected N or P FETs for respective single FETs, can be further hardened or enhanced against cosmic rays, particles, etc. by spacing the P FETs a predetermined distance apart so that an ion or other particle cannot strike or affect both channels simultaneously, thus avoiding upset. When these devices are placed in cells (i.e., ASIC) in logic or the like circuits, the predetermined spacing is related to cell height. Also, alignment of the gates of the substitution device on a common axis minimizes the window of a satellite through which a particle could effectively strike the common gate axis possibly to upset both gates.

8 Claims, 16 Drawing Sheets

SINGLE EVENT UPSET HARDENING CIRCUITS, DEVICES AND METHODS

BACKGROUND OF THE INVENTION

1. Field of the Invention

This invention relates to the field of series redundant circuits and devices, improved by further hardening against single event upset.

2. Prior Art

It has been learned that our satellites, such as the global positioning satellites used for accurate navigation around the world, have experienced multiple memory upsets as a result of particles from outer space colliding with the channels (or gates to influence the channels) of N and P field effect transistors forming various circuits thereof.

These circuits are usually CMOS/SOS and consequently include inherent hardening against upset. However, series redundancy has been found to further very substantially increase the resistance to the radiation effects.

SUMMARY OF THE PRESENT INVENTION

The present invention provides a unique circuit and layout methods for improving upon series redundant circuits.

A substitution device, comprising a pair of series connected to N or P FETs for respective single FETs, can be further hardened or enhanced against cosmic rays, particles, etc. by spacing the P FETs a predetermined distance apart so that an ion or other particle cannot strike or affect both channels simultaneously, thus avoiding upset. The similar separation of N FETs enhances hardening. When these devices are placed in cells (i.e., ASIC) in logic or the like circuits, the predetermined spacing is related to cell height. Also, alignment of the gates of the substitution device on a common axis minimizes the window of a satellite through which a particle could effectively strike the common gate axis possibly to upset all gates.

BRIEF DESCRIPTION OF THE DRAWINGS

FIG. 7 is a mask for laying down these doped regions;

DESCRIPTION OF THE PREFERRED EMBODIMENT OF THE INVENTION

In particular, cosmic rays effect devices of small feature size. They can cause a device to change state, creating bit errors and even burn-out. Cosmic rays consist of a shower of single heavy energetic particles. They interact by causing ionization along their track as they pass through a material. In the electronics field, a perturbation caused by one of these particles is called a single event upset (SEU).

The region of susceptibility within a FET is its channel region which can become conductive due to the charge generated by the heavy particle as it traverses through it. If the FET struck by the heavy particle was biased in the OFF state, and thus maintaining charge on a critical node, it will momentarily go into the ON state until the effects of the heavy particle go away. This momentary conduction may be long enough to discharge the critical node completely, thus causing loss of data.

Figure 1:
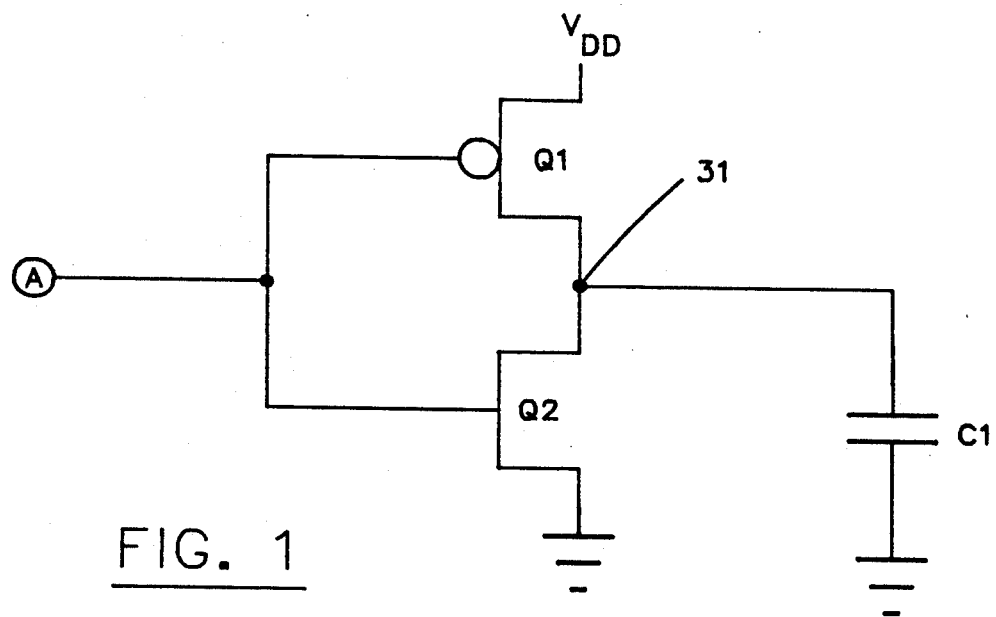
FIG. 1 is a circuit diagram of a prior art logical inverter type circuit.

This failure node is illustrated in FIG. 1 for an inverter. The inverter is comprised of an input signal A, a P-type FET (PFET Q1) connected between the power supply (VDD) and the output node 32, an N-type FET (NFET Q2) from the output node to ground and an output capacitance C1. For the case when the output of the inverter at C1 at a HIGH level (logic 1), and signal A is LOW (logic 0), PFET Q1 is ON and NFET Q2 is OFF. A heavy particle strike on the gate of Q2 can disrupt the logic level of the output of the gate. Such a strike will cause FET Q2 to go into momentary conduction, causing the output node at C1 to transition to a low state. PFET Q1 is still biased on, so the output level will not go completely to ground, and the overall effect of the heavy particle strike will be a spike on the output node to ground. However, this spike may be such that it is recognized by logic downstream as a pulse and may cause false triggering in succeeding logic stages. A similar scenario could be constructed for the output node LOW and PFET Q1 taking a hit from a heavy particle.

A new design approach has been implemented that results in circuits exhibiting high levels of SEU immunity. This approach utilizes the redundancy concept, whereby a single FET is replaced by two series FETs driven by the same input signal. The implementation of the same CMOS/SOS Inverter is shown in FIG. 2.

Figure 2:
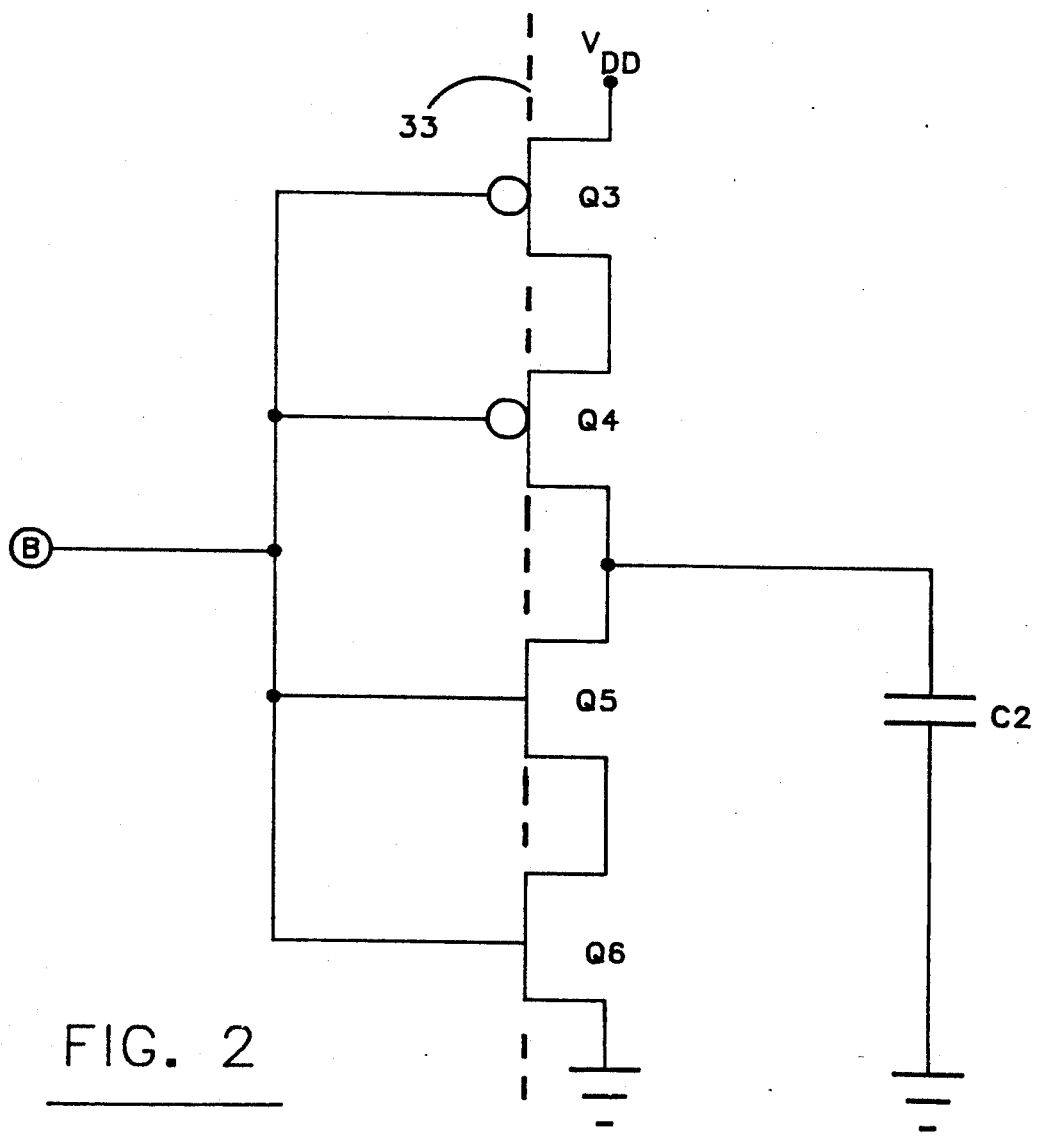
FIG. 2 shows the new maximally hardened inverter type circuit for replacing the circuit of FIG. 1.

As can be seen from FIG. 2, the single PFET and NFET in FIG. 1 are now replaced by two FETs in series for each. The benefit that this circuit implementation has over FIG. 1 is that it is much harder for the output of the inverter to upset due to effects of a heavy particle. For the same bias conditions as FIG. 1 (B input is LOW), PFETs Q3 and Q4 are both ON and NFETs Q5 and Q6 are both OFF. If ether Q5 or Q6 were hit by a heavy particle, only that transistor would go into conduction and the output node would not disrupt since the other FET would remain biased OFF. Likewise, if either Q3 or Q4 were to be hit by a heavy particle, the other PFET would prevent the output node from being upset.

This design approach was used to design logic and storage elements cells for the RadCELL 120 CMOS/SOS standard cell library. Although the CMOS/SOS technology is inherently hard to SEU upset, the design techniques in this disclosure increase even further the SEU tolerance of circuits fabricated in this technology. Dashed line 33 indicates the common axis alignment for all gates in this improved inverter circuit. Also, for ASIC (application specific integrated circuit), the P doped regions are spaced apart substantially maximally within the space selected.

Figure 3:
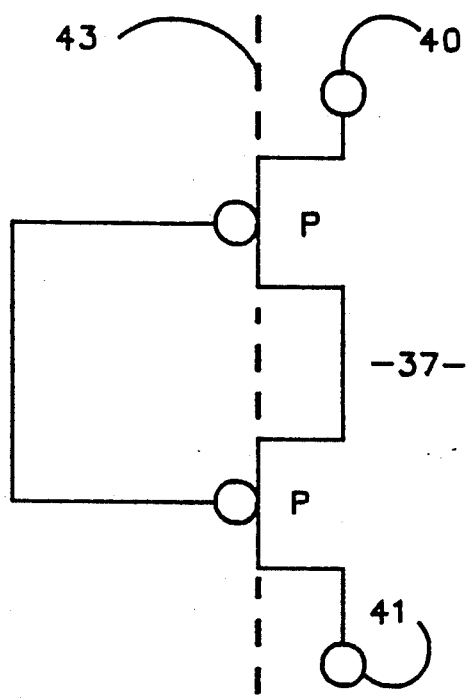
FIG. 3 shows the redundant P type replacement device for the PFET of FIG. 1.

The substitutional device 37 of FIG. 3 to take the place of e.g. Q1 of FIG. 1 comprises the two PFETs having their gates tied together and having terminals 40 and 41 for insertion into a circuit, such as an inverter, but not necessarily, as seven different logic circuits are made for the ASIC hardened library subset. The line 43 indicates that the gates of both P devices are aligned along a common axis and the substantial spacing apart of the respective P doped regions for these PFETs prevents a single ion from upsetting both PFETs.

Figure 4:
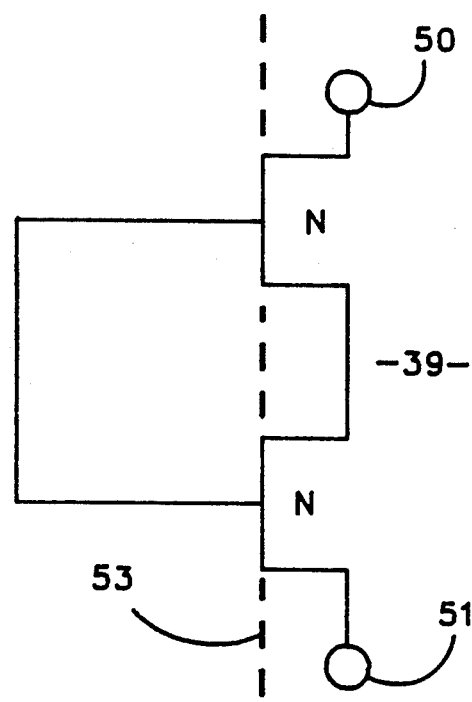
FIG. 4 shows the redundant N type replacement device for the NFET of FIG. 1.

Similarly in FIG. 4, the substitutional device 39 for e.g. Q2 of FIG. 1 is shown with the gates tied together and access terminals 50 and 51. Here again, the dashed line 53 indicates the alignment of the respective gates and the NFETs have their doped regions separated sufficiently that a single ion will not strike both NFETs.

Figure 5:
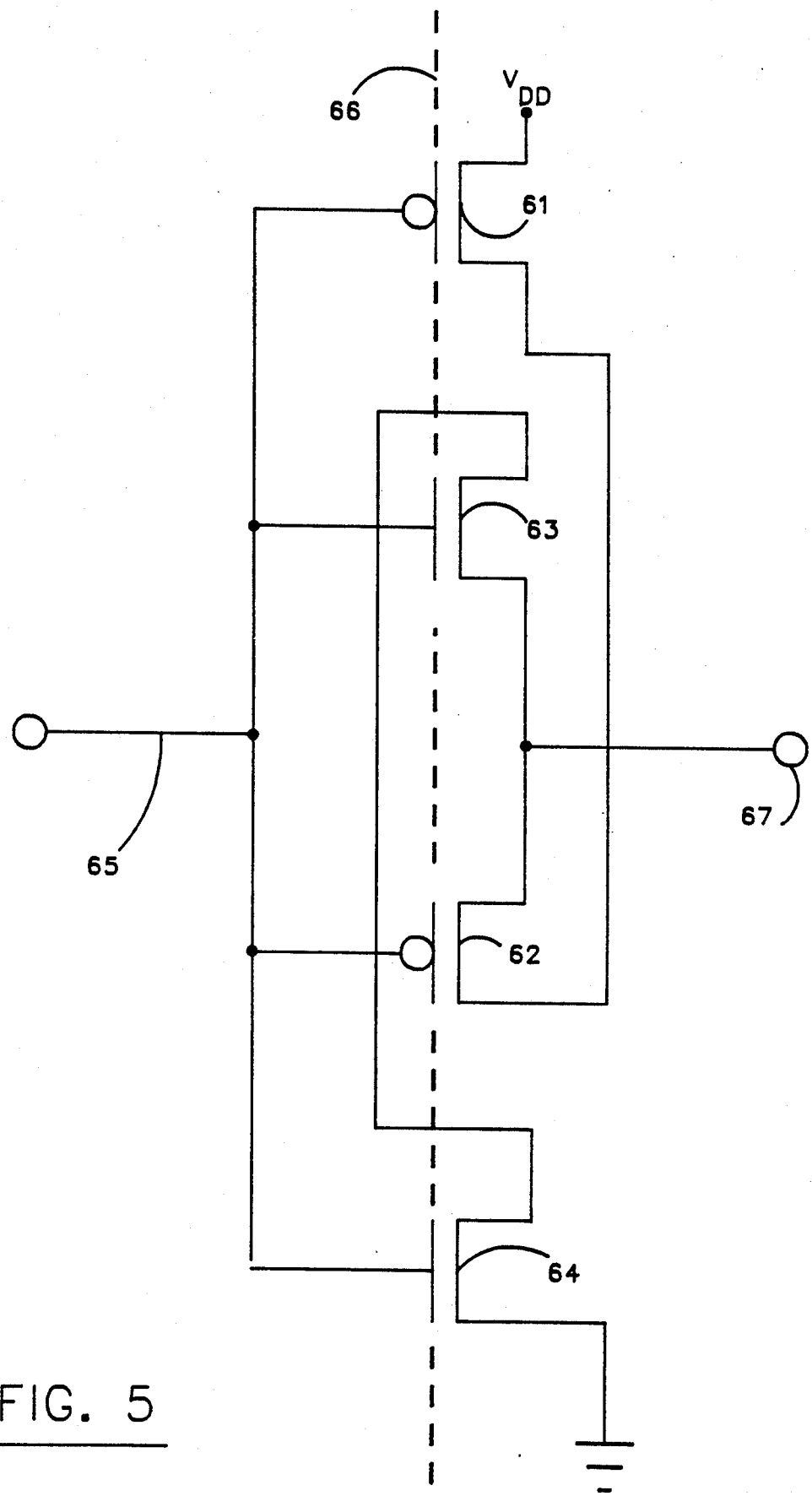
FIG. 5 shows the new maximally hardened circuit for replacing an inverter wherein two PFETs and two NFETs are alternated in layout positions with the PFETs being in series and the NFETs being in series, electrically.
Figure 7:
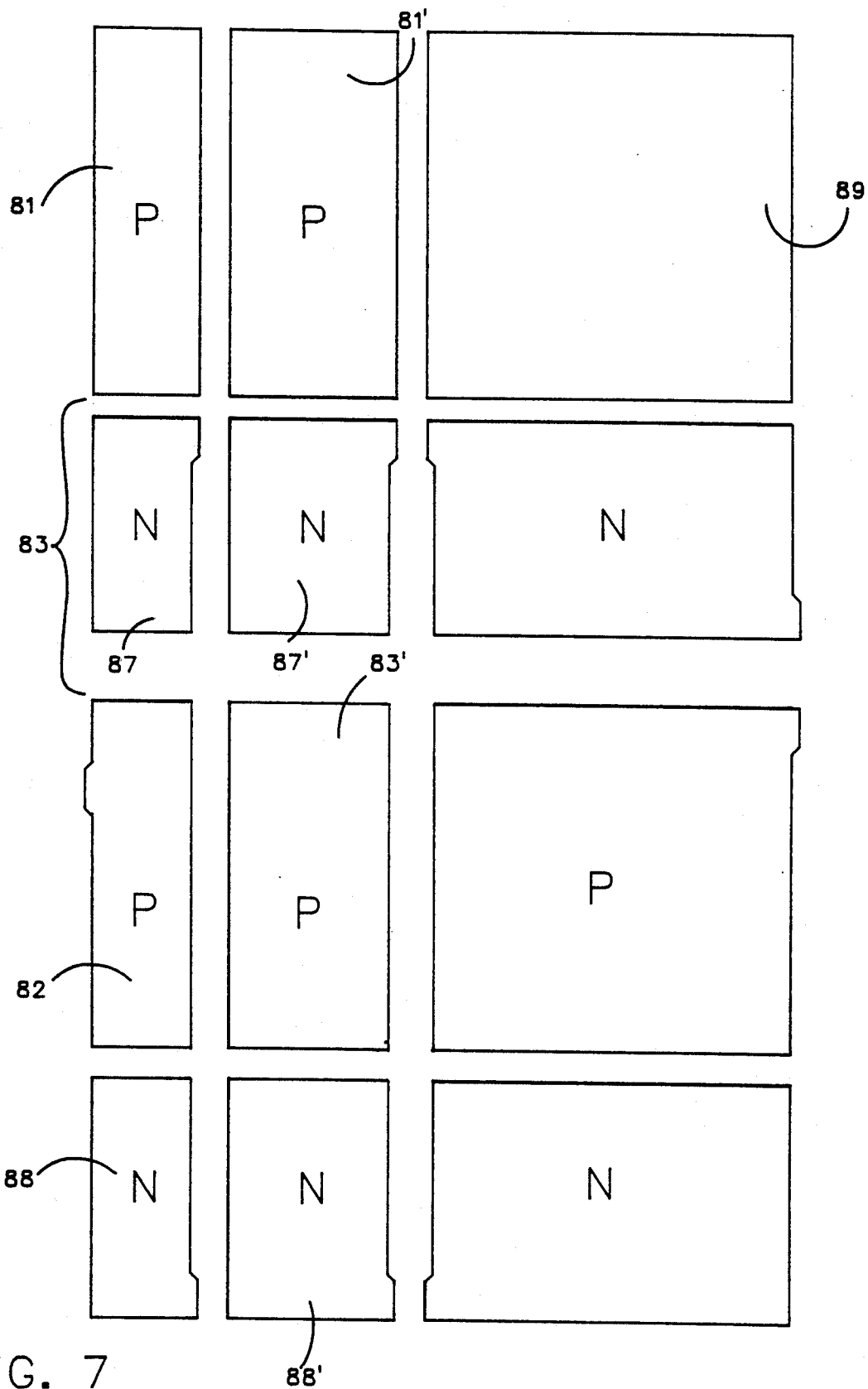
FIG. 7 shows the doped regions or islands for the circuit of FIG. 6, and also.

In FIG. 5, the improved inverter circuit employs two PFETs, 61 and 62, illustratively shown deployed apart, as in FIG. 7, and spaced apart NFETs 63 and 64. The input is applied to all four gates in parallel from terminal 65. The output is taken at terminal 67. It may be appreciated that the two PFETs are in series redundant connection and the two NFETs are in series redundant connection. The four gates of the devices are aligned on a common axis 66 and they are spaced sufficiently far apart that a single ion cannot strike both P or N devices, simultaneously.

Figure 6:
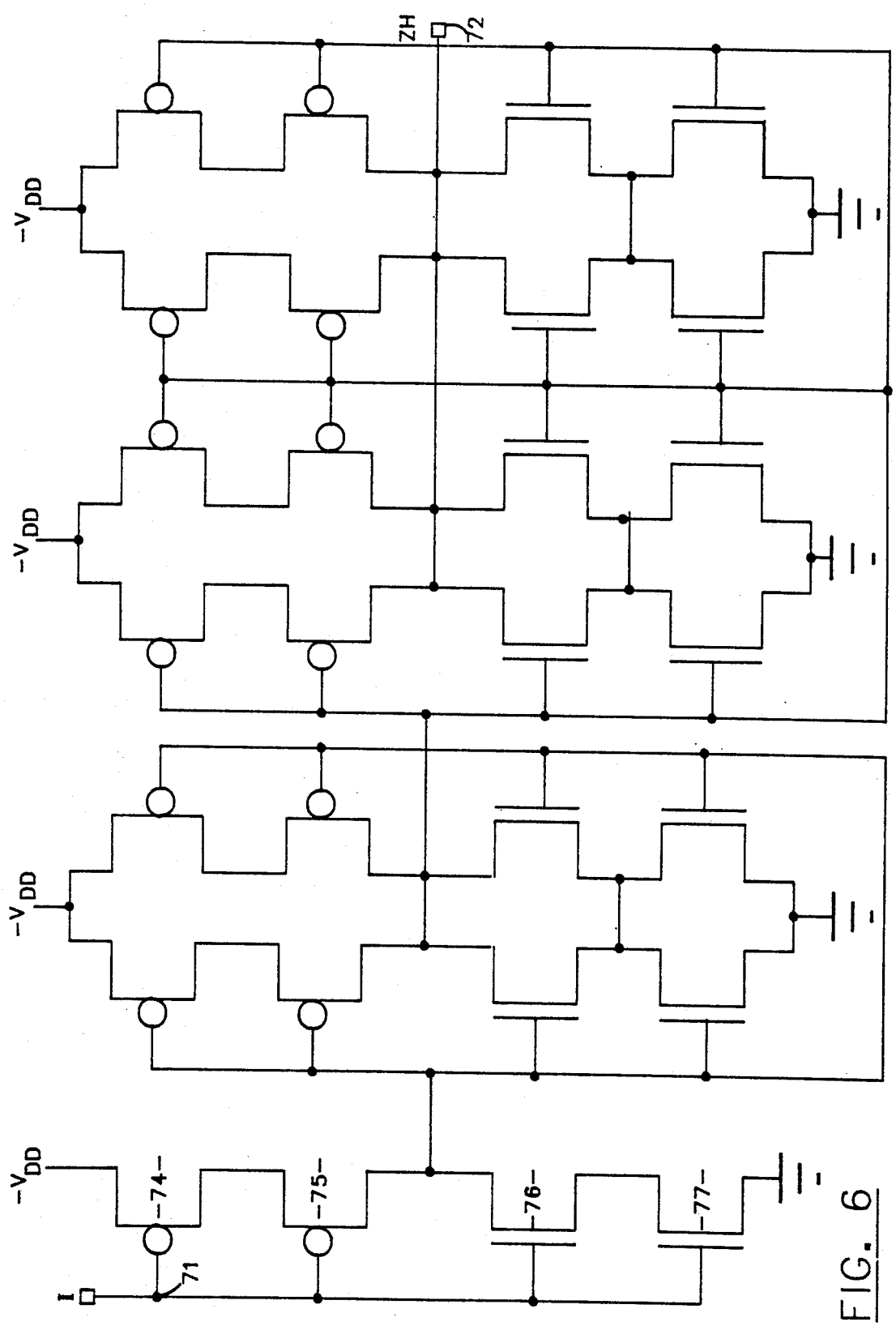
FIG. 6 is an ASIC computer drawing for a beefed-up inverter having a 1X section, 2X section, and 4X section, all comprising a single ASIC cell.

FIG. 6 is a printout from the Calma computer of a single hardened logic cell having an input at 71 on the left and an output at 72 on the right. As can be seen from examining each of the sections, series redundant PFETs such as 74 and 75 appear in circuit with series redundant NFETs 76 and 77 in each circuit configuration.

Thus, it will be appreciated that when these radiation hard cells are stored in the Radhard library, the computer can place them anywhere on any chip as an entity, thus, very rapidly completing the circuit.

FIGs. 7 through 11 show actual masks (treated herein as the structure) for building the circuit of FIG. 6. Normal CMOS conventional processing is employed but the computer assists greatly in providing approximately seven masks for each circuit. The other masks have been omitted because they do not bear on the invention and anyone skilled in the art can make such masks.

Returning to FIG. 7, it will be seen that the upper left hand P doped section 81 is provided for PFET 74 of FIG. 6 whereas the lower P doped section 82 is provided for PFET 75. It now becomes apparent that the spacing between these PFETs is maximized within the cell being about 28.8 microns as determined by the double headed arrow length 83. Similarly, the NFETs are spaced even further apart because the P sections must be larger and the corresponding spacing is about 41.2 microns (not illustrated by number).

Returning to FIG. 6 again, the NFET 76 is deployed o doped N section 87 of FIG. 7 and NFET 77 is made on N doped island 88.

This procedure can be traced through for the entire circuit of FIG. 6 with the double row of inverters being made on the wider P doped sections 81' and 83' and corresponding N doped sections 87' and 88'. The third section on the right, including P section 89, is provided for the four rows of inverters in the 4X inverter circuit of the right hand side of FIG. 6.

Figure 8:
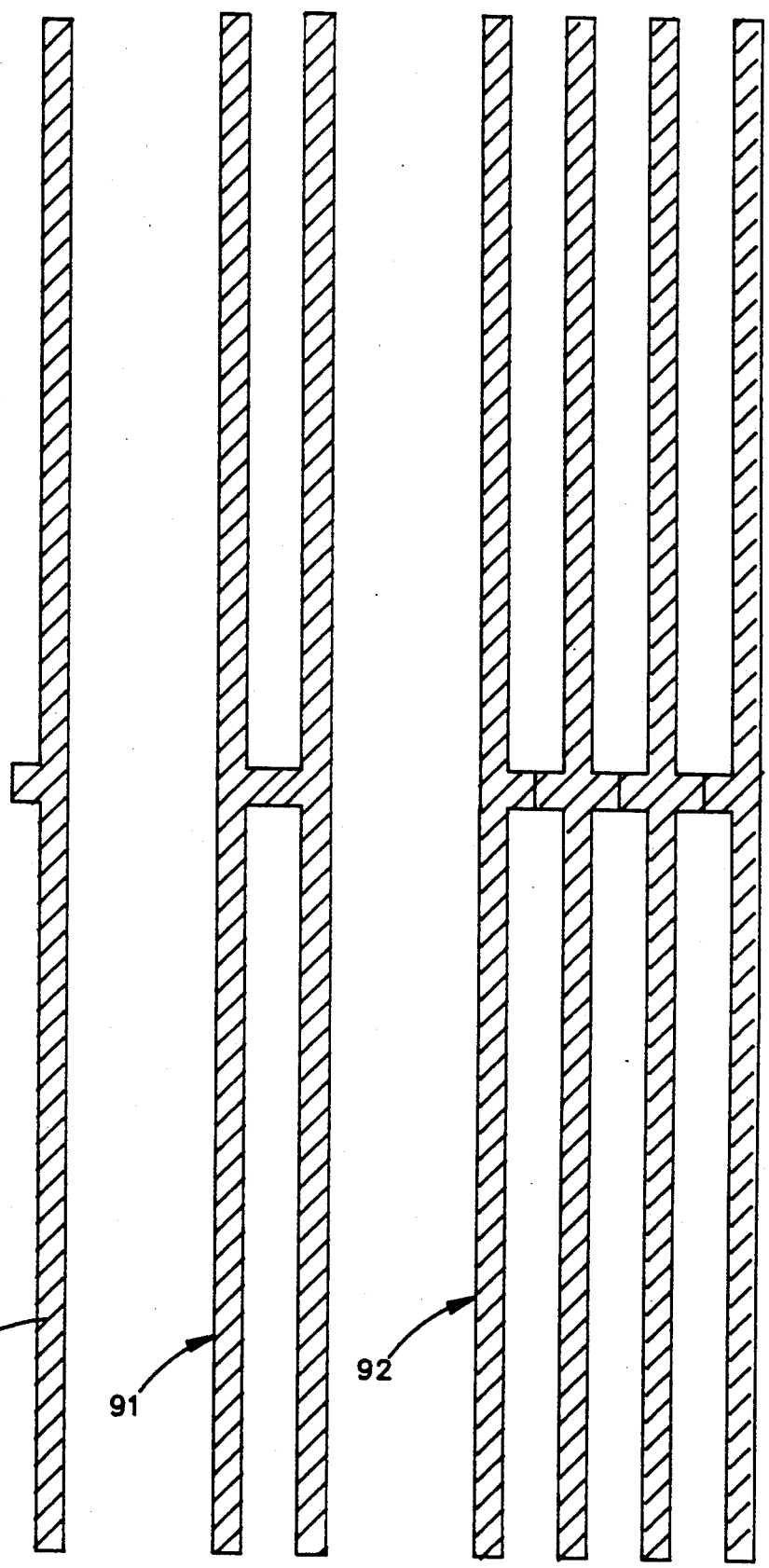
FIG. 8 shows the mask for the polysilicon gates to make the circuit of FIG. 6.

FIG. 8 shows the polysilicon gates made contiguous so that all gates are integral in each inverter line. Thus, the left hand polysilicon strip 90 is provided for the gates of PFETs 74 and 75 as well as NFETs 76 and 77 whereas the double poly gates 91 and the quadruple poly gates 92 are used for the 2X section and the 4X section of FIG. 6.

Figure 9:
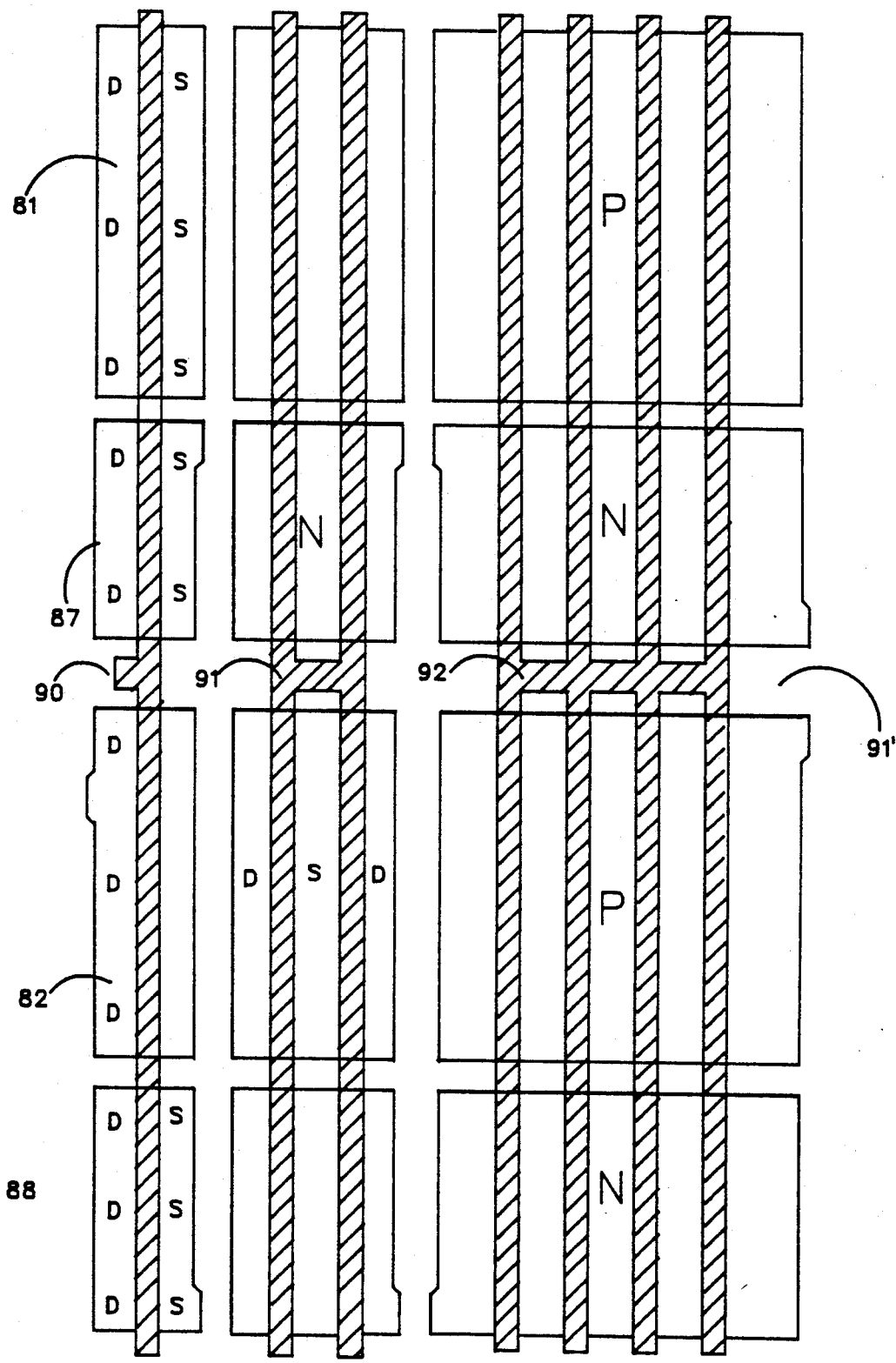
FIG. 9 shows the gates superimposed over the doped regions for the circuit of FIG. 6.

In FIG. 9, it may be seen that the single polysilicon strand 90 extends between the elongated drain and source of the P doped region 81. There are not four separate drains and four separate sources here, but rather these indications simply mean that the drain extends the length of the P doped section 81 and the source extends the length of the P doped section 81. The same is true for sections 87, 82 and 88, etc. Region 91 is left o pen to serve as interconnect spaces. Since the P doped region has one half the mobility as the N doped region, it is twice the size of the N doped region. The masks were simply omitted for the drain and source doping.

Figure 10:
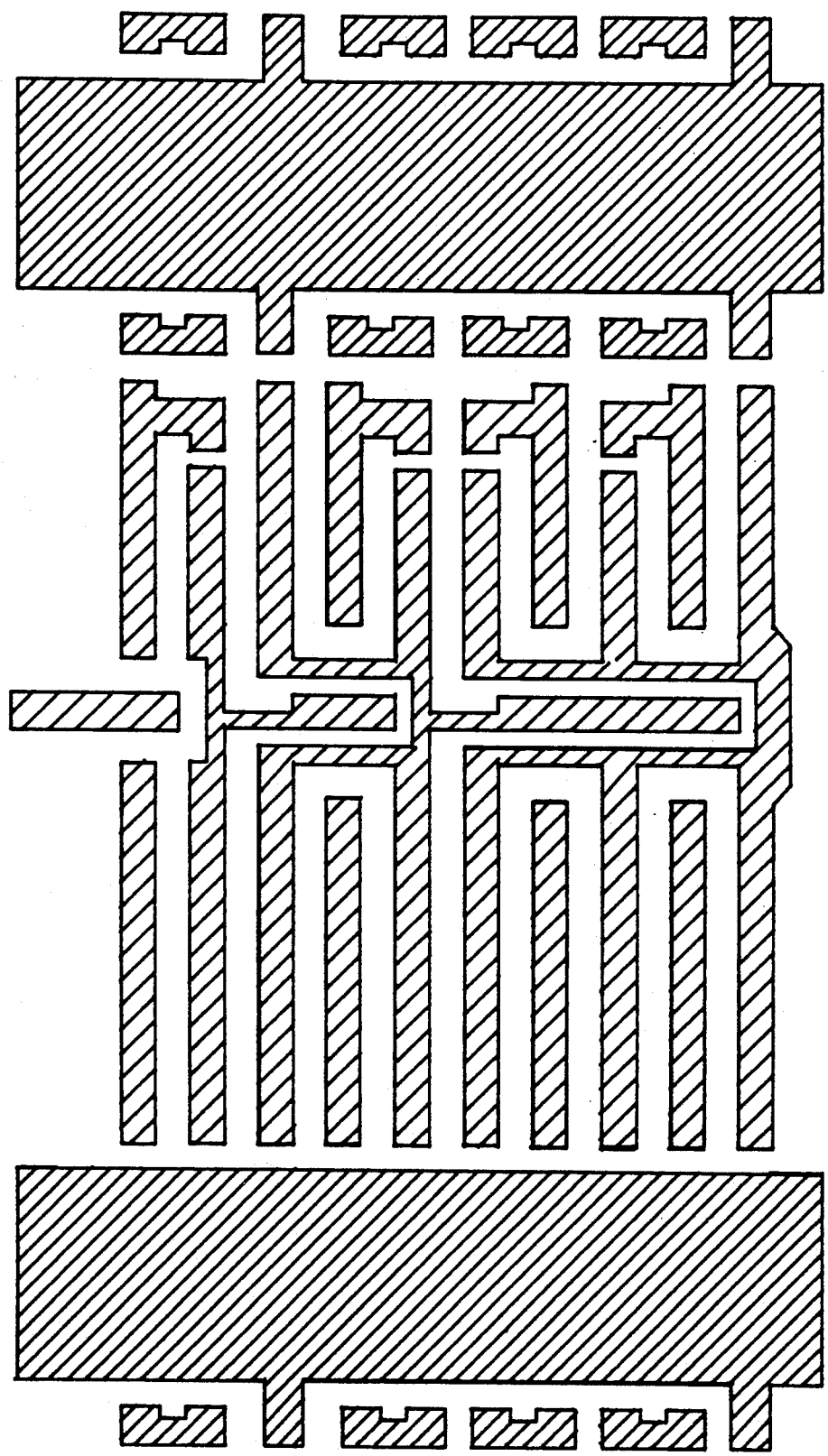
FIG. 10 is a first metal mask for the structure of the masks of FIG. 9.
Figure 11:
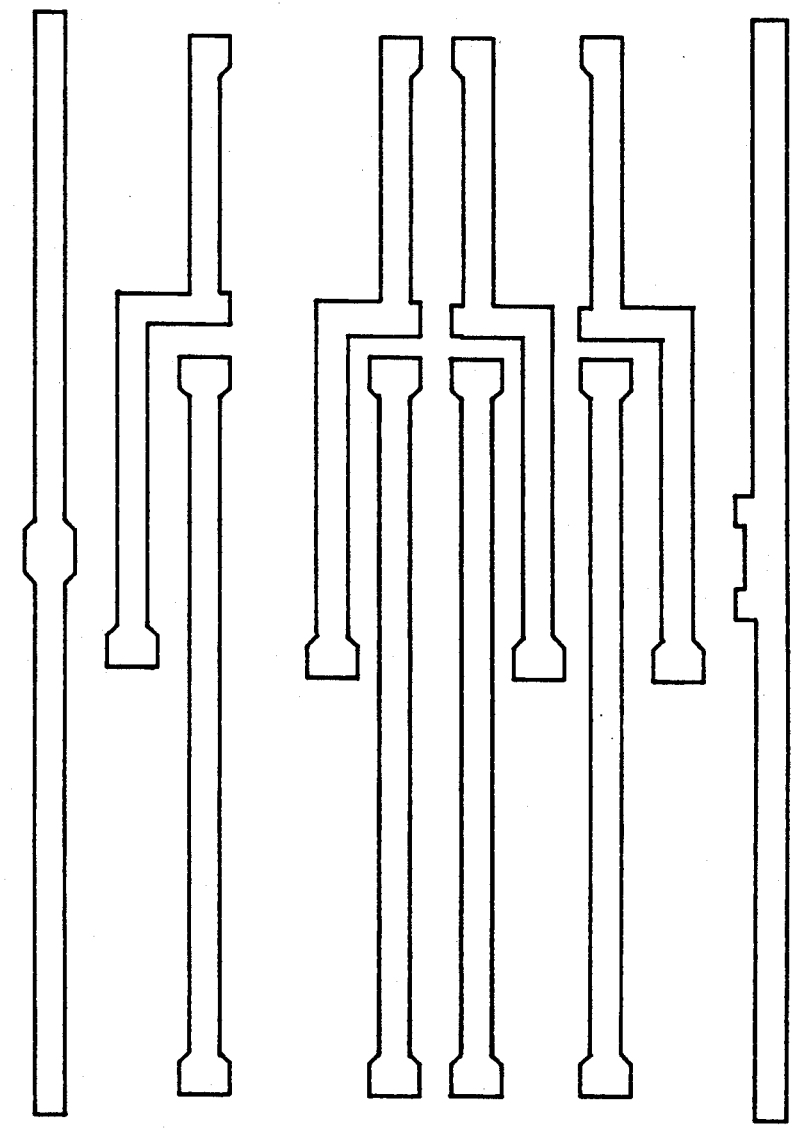
FIG. 11 is the metal 2 mask that overlies this structure after the metallization of FIG. 10 has been completed such that these two FIGs. together show the connections made for the circuit of FIG. 6.

In FIG. 10, the metal 1 is shown and it is possible to trace out circuits if this is included with the showing of metal 2 in FIG. 11 both over FIG. 9. The actual circuitry of FIG. 6 may laboriously be traced out but the superposition of these layers causes a most complex drawing unsuitable for printing in a patent.

Figure 12:
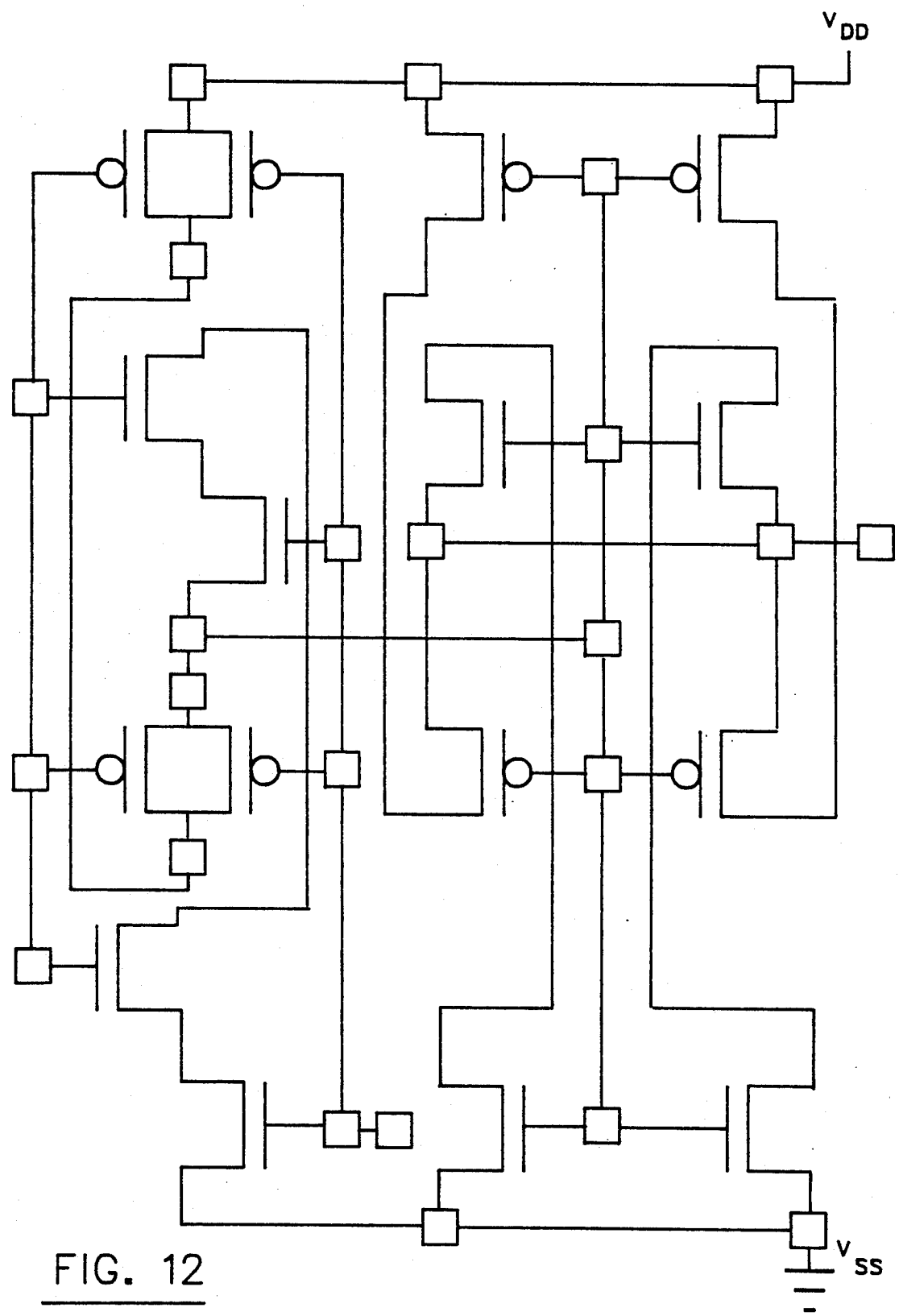
FIG. 12 shows the computer printout circuit for a two input AND gate comprises of a NAND followed by an inverter for processing in accordance with the present invention.

FIG. 12 is simply provided to show the computer circuitry within the ASIC Radhard library of a two input NAND which is built similarly to the front end of a two input AND gate except that it is doubled to reduce its output impedance to twice that of a conventional NAND gate. Here again, the PFETs and NFETs are of a type wherein the gate is on a common axis and the spacing is adequate to prevent simultaneous upset.

Figure 13:
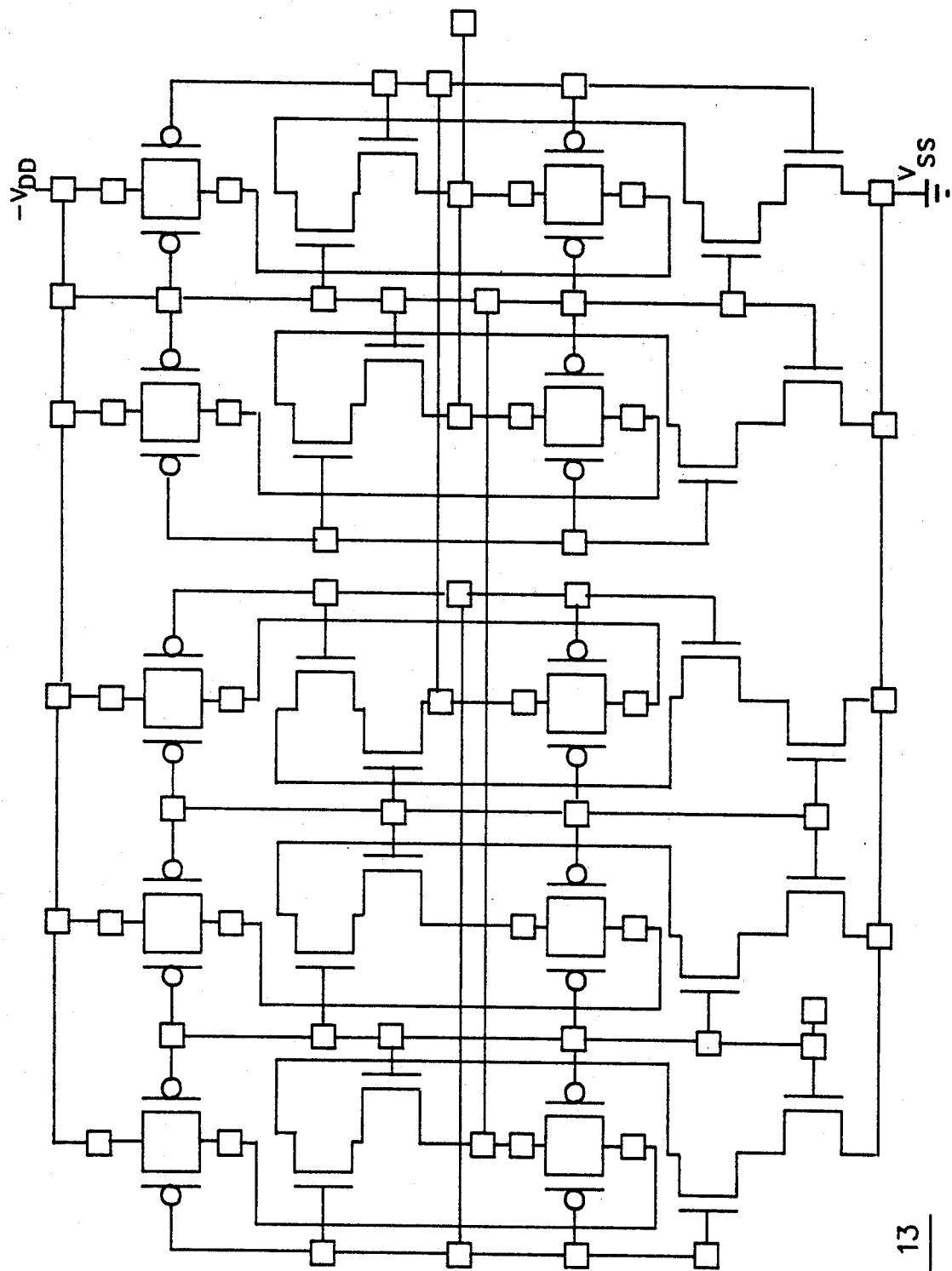
FIG. 13 shows an exclusive OR gate built from four NAND gates by the computer in accordance with the Radhard cell library.

FIG. 13 shows a different one of the logic circuits allocated to the Radhard library and this is an exclusive OR circuit. It is built from four NAND gates with its output NAND gate being double to again reduce output impedance. ORing was not used in any of these circuits because it is undesirable to have more than two PFETs in series when considering total dose susceptibility.

Other circuits not directly shown which are being built for the Radhard library include a two input AND gate comprised of a NAND followed by an inverter, a three input NAND gate, and a D flip-flop which is implemented using five two input NAND gates and one three input NAND gate. The clock input and both outputs are buffered with double size inverters. Then, there are the single X, 2X, and 4X inverters.

Figure 17:
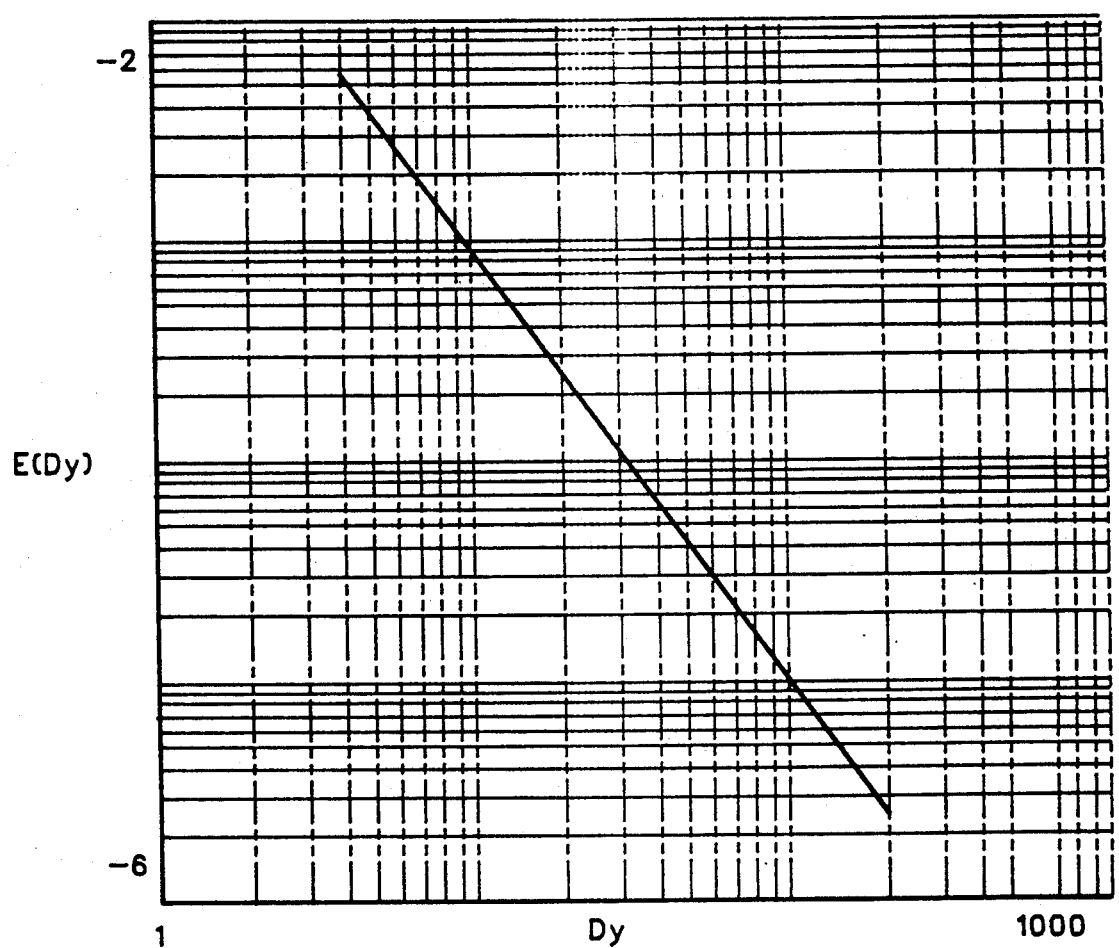
FIG. 17 shows the fractional exposure for parallel surfaces with the distance between FETs in microns as the horizontal dimension and exposure as the ordinate.

Computer determinations were made to provide the validity of the aligning of the gates or FETs on a common axis as being the maximum positioning available for minimal upset. The chart of FIG. 17 shows that for approximately 100 micron separation of the FETs or their gates, an improvement to upset is about $1 \times 10^{-5}$. In reality, the further the spacing the less likelihood of upset along the common axis but in keeping with saving of real estate, our spacing in the ASIC system is less than half of this figure, but the results are available from FIG. 17 for such spacings.

The quantitative analysis of the benefit of the redundant FET design over a standard design as a function of the distance between adjacent FETs is developed using FIGs. 14a and 14b, 15a and 15b, and 16a and 16b. The effect of staggering the FETs on the die instead of lining them up end to end is considered with respect to FIG. 14b.

The MatchCAD software package for the PC was used and the numbers used reflect worst case dimensions used in ASICs in accordance with this invention. The definite integrals were evaluated for various adjacent FET distances and plotted on the log-log graph of FIG. 17. The "Fractional Exposure" is a measure of the improvement of the SEU probability in a redundant FET design versus a conventional design. The assumptions used are that the probability of SEU is proportional to both the surface area and the range of possible angles of incidents. In a conventional design, the FET can be upset from any angle. In two dimensions, $2\pi$ (360 degrees) represents all angles but since we don't want to consider each ray twice, the exposure is actually $\pi$. In three dimensions this becomes $\pi$ squared, a solid angle. So the normal redundant exposures are:

$$E_n = kA\pi^2 \quad E_r = k \int_0^{Lz} \int_0^{Lx} (\theta x \, \theta z) dx \, dz$$

where A:=Lx Lz (rectangular surface area) and k is the proportionality constant.

The Fractional Exposure then, is the ratio of the redundant to the normal exposures, as follows:

$$E = \frac{E_r}{E_n} \quad E = \frac{\int_0^{Lz} \int_0^{Lx} (\theta x \, \theta z) dx \, dz}{Lx \, Lz \, \pi^2}$$

The above equation is evaluated using maximum and worst case dimensions for a redundant FET cell design. All dimensions are in microns and all angles are in radians. For parallel surfaces, the double integral can be simplified to multiplying two single integrals. For perpendicular surfaces, this is not the case since both $\theta x$ and $\theta z$ change as you go from 0 to Lx or as you go from 0 to Lz.

Figure 14A:
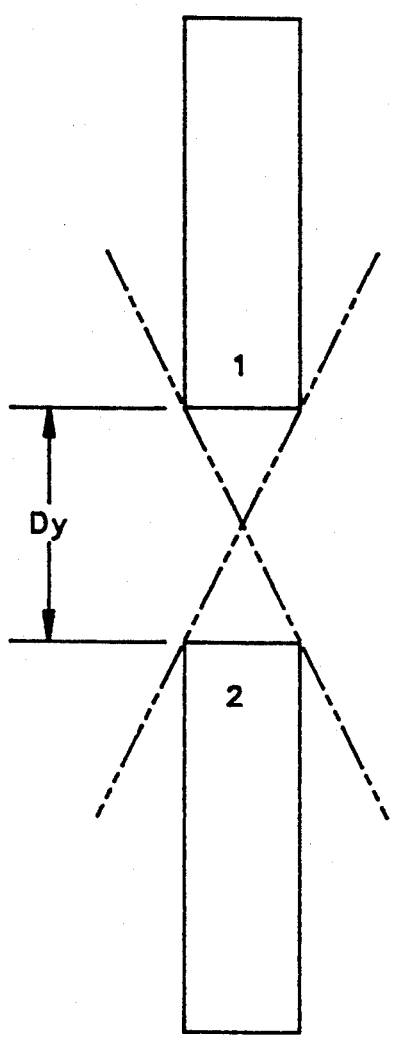
FIG. 14a shows redundant FETs lined up end to end for purposes of calculating the likelihood of a single ion upsetting both gates or FETs.
Figure 14B:
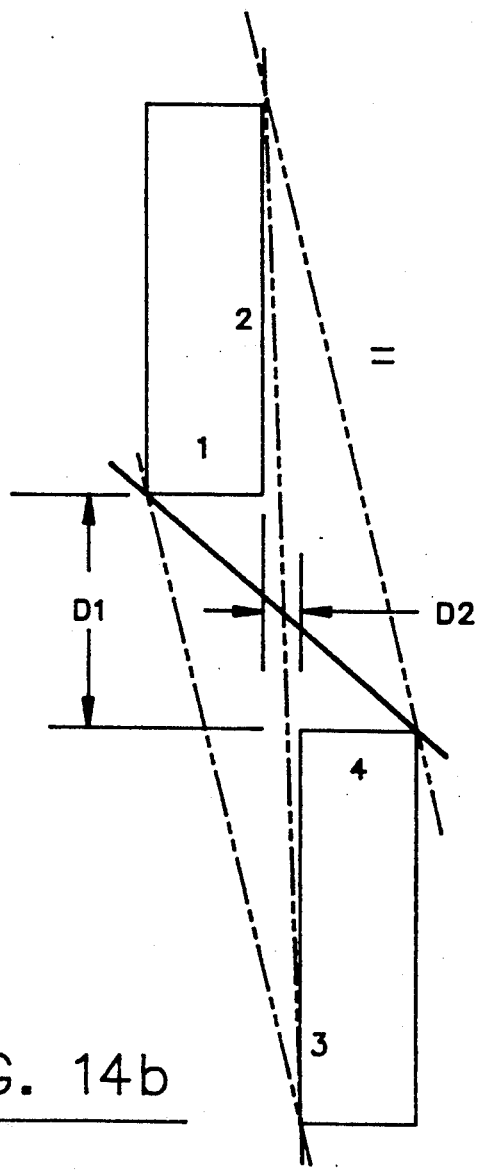
FIG. 14b shows the FETs or gates staggered for the same calculation purposes because there are more surfaces to consider when the FETs are staggered.
Figure 15A:
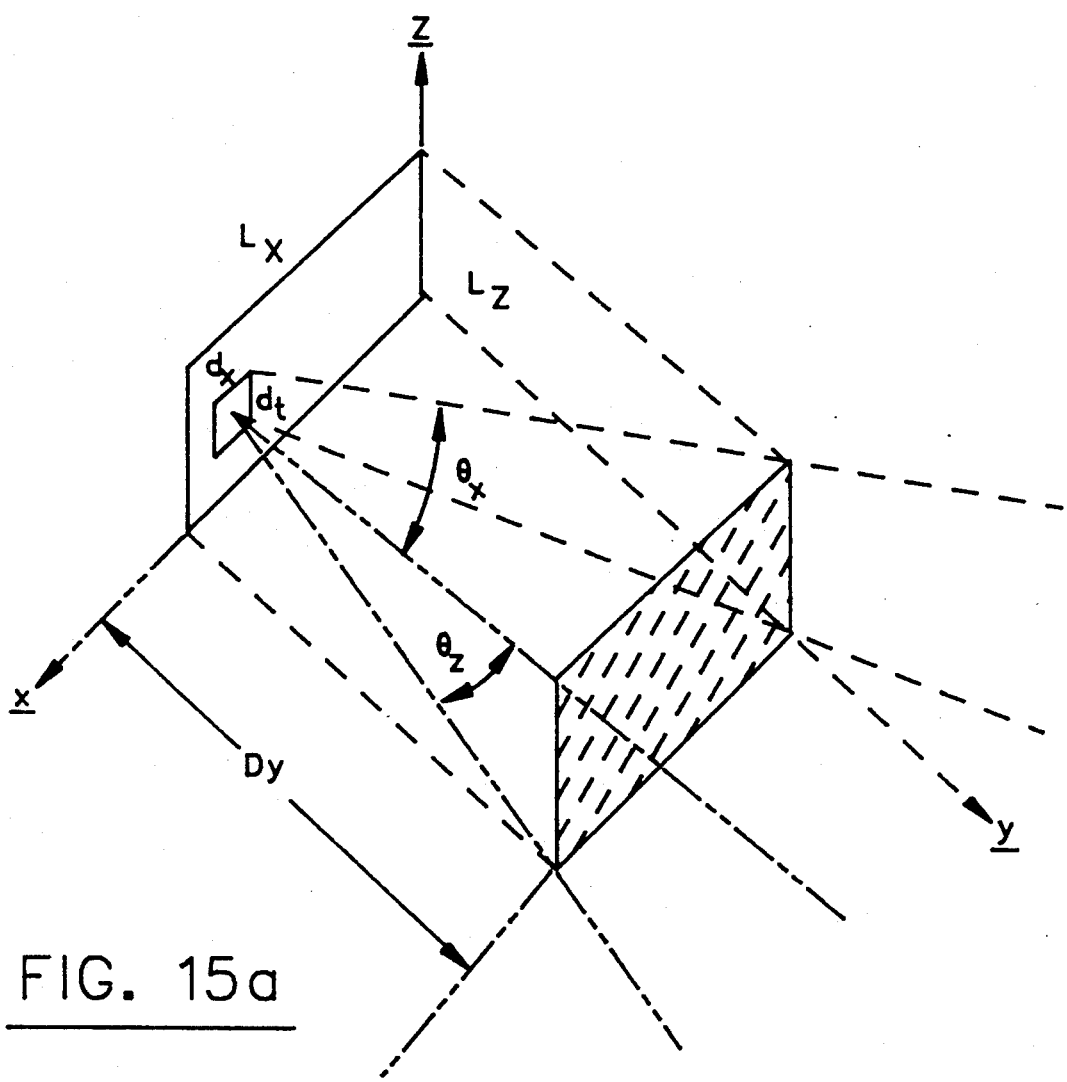
FIG. 15a is a geometrical layout for the analysis for parallel surfaces.
Figure 15B:
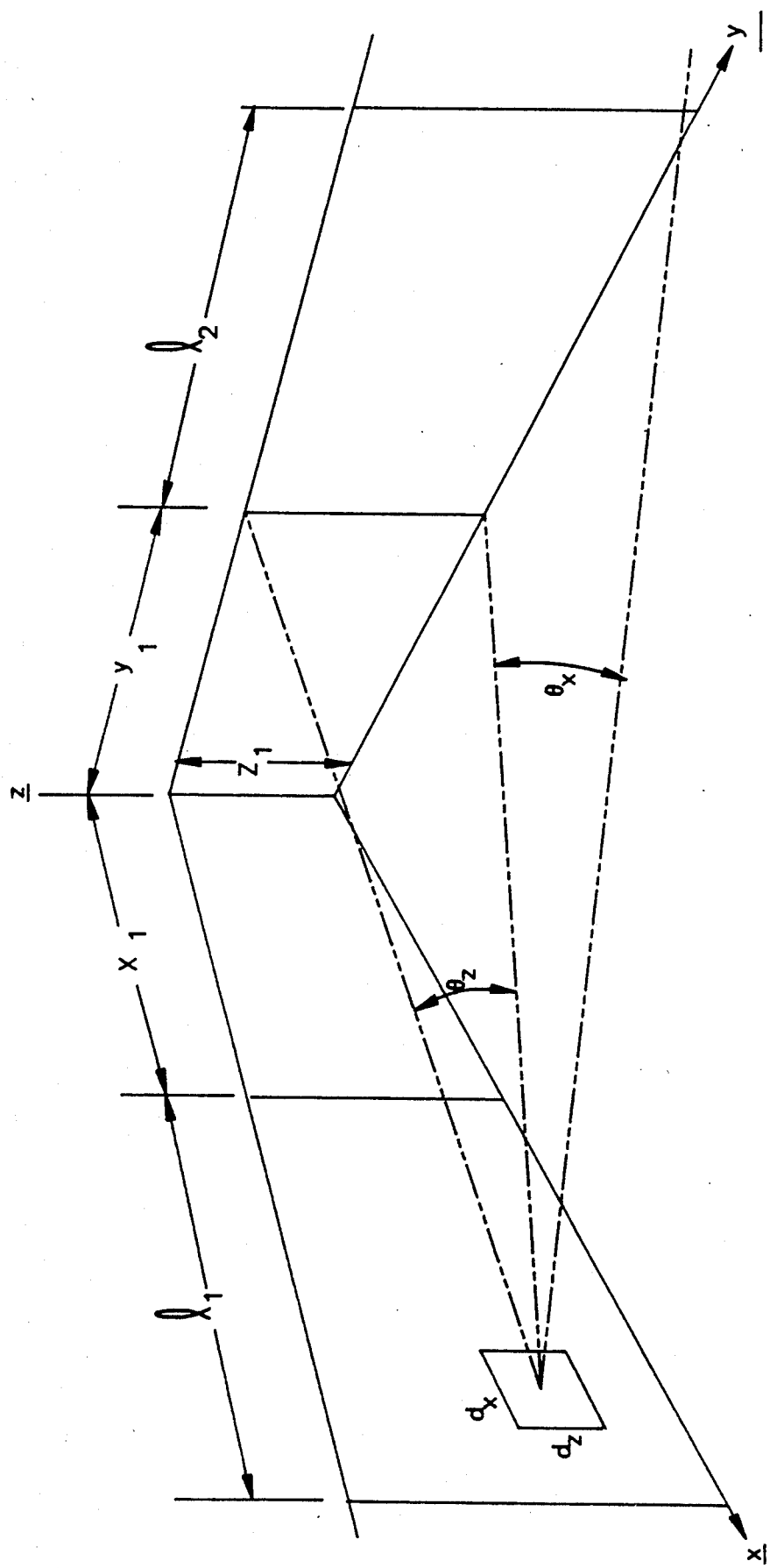
FIG. 15b is a similar layout for perpendicular surfaces.
Figure 16A:
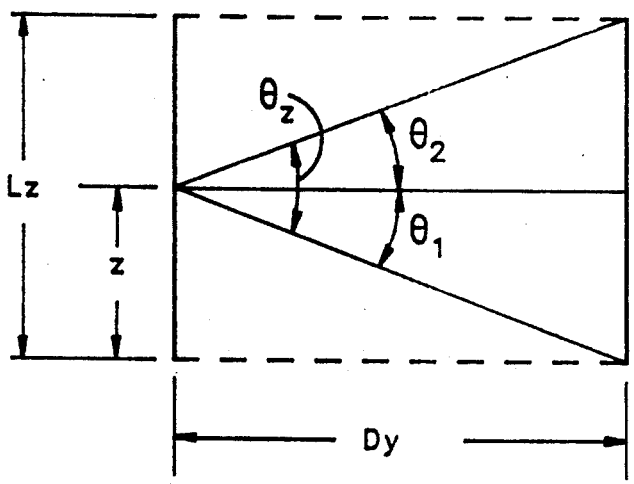
FIG. 16a is a side view of the parallel surface's situation.
Figure 16B:
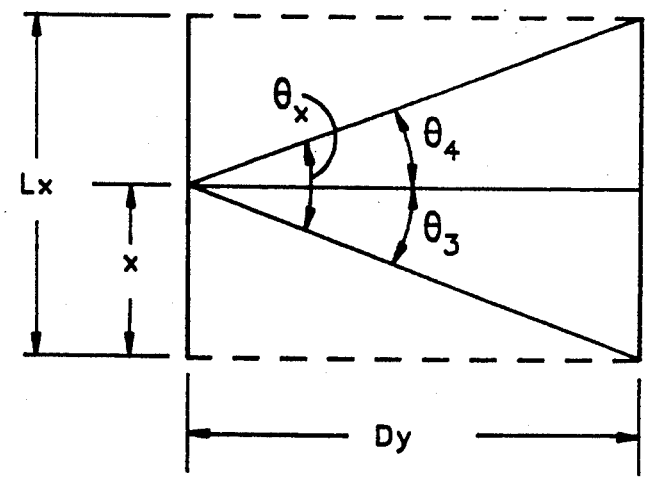
FIG. 16b is the top view of the parallel surface's configuration.

Two types of geometries are considered for the redundant FET design. The first is placing the redundant FETs lined up end to end (FIG. 14a) and the second is to stagger them (FIG. 14b). There are more surfaces to consider when the FETs are staggered. The end to end geometry is actually a special case of the staggered geometry, when the stagger distance is zero.

Although the staggered geometry has four pairs of surfaces to consider, the pair with the largest surface area proves to be dominant and by itself provides less SEU protection than the simple end to end geometry. The additional pairs of surfaces unfortunately only provide additional exposure. The only chance of improvement by staggering is when the FETs are staggered by a very small amount so that the largest surface areas are almost lined up as in the end to end case. The problem is that the benefit gained by staggering the ends is far outweighed by the loss from the large surface areas of the sides as they come in to play.

From FIG. 16:

Given: $Lz := 0.6$ $\quad Dy := 4,29 \ldots 204$ (range of values)
$Lx := 1.6$ $\quad$ Note: all lenths are in microns $\theta 1(z) := \operatorname{atan} \frac{z}{DY} \quad \theta 3(x) := \operatorname{atan} \frac{x}{Dy}$ $\theta 2(z) := \operatorname{atan} \frac{Lz - z}{Dy} \quad \theta 4(x) := \operatorname{atan} \frac{Lx - x}{DY}$ $$E(Dy) := \frac{1}{Lx \, Lz \, \pi^2} \int_0^{Lz} \int_0^{Lx} (\theta 1(z) + \theta 2(z))(\theta 3(x) + \theta 4(x)) \, dx \, dz$$

In conclusion, the end to end geometry is a sound one that minimizes the probability of SEU in a redundant FET design since a cosmic ray must hit both FETs to cause an upset in the logic. Given the 1.6 micron gate length and the 0.6 micron max depth of the depletion region, the maximum gate width is about 38.5 microns. At the current stage of development the end to end distance is about 40 microns. Reading the log-log graph in FIG. 17 gives:

$E = 6 \times 10^{-5}$ $P_r = EP_n$

This result can be interpreted as the factor of improvement in the probability of SEU of a redundant FET design over that of a conventional design currently in the radiation hard cell library.

What is claimed is:

1. A single event upset hardened replacement on-off device for a P field effect transistor, comprising in combination:
   a first P field effect transistor having a source and drain and channel therebetween and a gate over the channel;
   a second P field effect transistor having a source and drain and channel therebetween and a gate over the channel;
   said transistors being connected in series through their sources and drains;
   a connection between the gate of the first transistor and the gate of the second transistor;
   said transistors being spaced apart a predetermined distance sufficient to preclude a penetrating particle from affecting both channels thereof to establish a perturbation in said device; and, said gates being substantially aligned along the lengths thereof.

2. The device of claim 1, further comprising a similar hardened replacement device for an N field effect transistor, said similar hardened device employing a pair of N field effect transistors connected in series, each having a source and rain and a channel therebetween, and a gate over the channel, said N transistors being connected in series through their sources and drains and the gates of said similar replacement device connected together and connected to the gates of the P transistors;

a connection between said series connected P transistors and said series connected N transistors connecting them in series;

said first P transistor adapted to be connected to a source of potential and one of said N transistors adapted to be connected to a different source of potential.

3. The device of claim 2 including said similar N transistor replacement device, further comprising:

an input connection to said gates and an output connection from the series connection between the pair of N transistors and the pair of P transistors; to comprise an inverter circuit hardened against single event upset; and, said N transistors being spaced apart a predetermined distance sufficient to preclude a penetrating particle from affecting both channels of the similar device to upset the similar device when in the off state.

4. A single event upset hardened replacement on-off device for a N field effect transistor, comprising in combination:

a first N field effect transistor having a channel, a gate thereover and a source and drain on opposite sides of the channel;

a second N field effect transistor having a channel, a gate thereover and a source and drain on opposite sides of the channel of the second N transistor;

said transistors being connected in series through their sources and drains;

a connection between the gate of the first transistor and the gate of the second transistor;

said transistors being spaced apart a predetermined distance sufficient to preclude a penetrating particle from adversely affecting both channels thereof of said device; and, said gates being substantially aligned along the lengths thereof.

5. A multi-circuit logic cell hardened against singe event upset characterized by:

at least one circuit comprising a pair of series connected P field effect transistors, each including a channel, a gate thereover, source and drain, said transistors being spaced apart a predetermined distance in said cell sufficient to preclude a penetrating particle from affecting both channels thereof to adversely affect both transistors thereof; and, said gates being at least substantially aligned along the lengths thereof.

6. The cell of claim 5, wherein:

said spacing between the gates is of the order of 29 microns.

7. A multi-circuit logic cell hardened against single event upset characterized by:

at least one circuit comprising a pair of series connected N field effect transistors, each including a channel, a gate thereover, source and drain, said transistors being spaced apart a predetermined distance in said cell sufficient to preclude cosmic rays from affecting both channels thereof to adversely affect both transistors thereof; and, said gates being at least substantially aligned along the lengths thereof.

8. The cell of claim 2, wherein:

said spacing between the gates is of the order of 41 microns.

* * * * *

UNITED STATES PATENT AND TRADEMARK OFFICE
CERTIFICATE OF CORRECTION

PATENT NO. : 5,175,605
DATED : December 29, 1992
INVENTOR(S) : James A. Pavlu and Gary L. Heimbigner It is certified that error appears in the above-identified patent and that said Letters Patent is hereby corrected as shown below:

Column 1, line 30, please delete the word "to."
Column 7:
Claim 2, line 10, please change "rain" to --drain--.
Column 8:
Claim 5, line 15, please change "singe" to --single--.

Signed and Sealed this

Second Day of November, 1993

Attest:

BRUCE LEHMAN

Attesting Officer    Commissioner of Patents and Trademarks